_United States Patent_ [19]

Fujimaki et al.

[11] 4,014,980

[45] Mar. 29, 1977

[54] METHOD FOR MANUFACTURING GRAPHITE WHISKERS USING CONDENSED POLYCYCLIC HYDROCARBONS

[75] Inventors: Hiroto Fujimaki; Haruhisa Hayashi; Takashi Kawahara, all of Tokyo, Japan

[73] Assignees: Kureha Kagaku Kogyo Kabushiki Kaisha, Tokyo; Toyo Boseki Kabushiki Kaisha, Osaka, both of Japan

[22] Filed: July 29, 1975

[21] Appl. No.: 600,078

Related U.S. Application Data

[63] Continuation-in-part of Ser. No. 382,128, July 24, 1973, abandoned.

[30] Foreign Application Priority Data

July 27, 1972   Japan .............................. 47-74557

[52] U.S. Cl. .......................... 423/448; 423/447.3; 423/450
[51] Int. Cl.² ........................................ C01B 31/04
[58] Field of Search .......... 423/445, 447, 448, 450, 423/458, 447.1–447.9

[56] References Cited

UNITED STATES PATENTS

| | | | |
|---|---|---|---|
| 3,057,687 | 10/1962 | Mitchell | 423/448 |
| 3,347,776 | 10/1967 | Mitchell et al. | 423/448 |
| 3,378,345 | 4/1968 | Bourdeau | 423/447 |
| 3,411,949 | 11/1968 | Hough | 423/450 |
| 3,442,617 | 5/1969 | Turkat et al. | 423/448 |
| 3,531,249 | 9/1970 | Turkat | 423/448 |
| 3,580,731 | 5/1971 | Mileuski | 423/447 |
| 3,851,048 | 11/1974 | Araki et al. | 423/458 |

FOREIGN PATENTS OR APPLICATIONS

| | | | |
|---|---|---|---|
| 556,074 | 4/1958 | Canada | 423/447 |
| 1,269,933 | 6/1968 | Germany | 423/447 |

OTHER PUBLICATIONS

Carbon–_Formation of Carbon Fibers from Benzene_—Koyama—Dec. 1972—pp. 757, 758.
Japanese Journal of Applied Physics–_Carbon Fibers Obtained by Thermal Decomposition of Vaporized Hyprocarbon_—Koyama et al.-Apr. 1972—pp. 445–449.
Carbon—_Formation of Carbon Fibers from Acetylene_—Tesner et al.—1970—pp. 435–442.
I & EC—Carbonization of Anthracene & Graphitization of Anthracene Carbons—Kinney et al.—1957—pp. 880–884.

_Primary Examiner_—Oscar R. Vertiz
_Assistant Examiner_—Eugene T. Wheelock
_Attorney, Agent, or Firm_—Flynn & Frishauf

[57] ABSTRACT

A method for manufacturing graphite whiskers which comprises: mixing one or more of gasified compounds having a condensed polycyclic structure of two to five benzene rings with a large amount of inert gas containing a small amount of $CO$, $CO_2$ or $H_2O$; heating said gas mixture at 700° to 1200° C and a substantially atmospheric pressure to generate precursory carbon whiskers comprised of numerous carbon crystals orientated in a form of single sheet which is rolled up like a scroll or a plurality of separate sheets rolled in concentric relationships; and graphitizing said carbon whiskers at temperatures of 2700° to 3000° C in an atmosphere of inert gas.

7 Claims, 8 Drawing Figures

METHOD FOR MANUFACTURING GRAPHITE WHISKERS USING CONDENSED POLYCYCLIC HYDROCARBONS

CROSS-REFERENCE TO RELATED APPLICATION

This application is a continuation-in-part of our co-pending Ser. No. 382,128, filed July 24, 1973, and assigned to the same assignee as the present invention.

BACKGROUND OF THE INVENTION

This invention relates to a method for manufacturing graphite whiskers, and more particularly to a method for manufacturing graphite whiskers from organic compounds having a condensed polycyclic structure.

The prior art processes of manufacturing graphite whiskers may be broadly classified into two types. One of them reported by Roger Bacon consists in depositing graphite whiskers by means of a dc arc at high temperature and pressure (Journal of Applied Physics 31, 283 to 290, 1960). According to this report, graphite whiskers 1 to 5 microns in diameter and about 3 cm long were grown in a dc arc derived from graphite electrodes at a temperature of about 3700° K in an atmosphere of argon at 92 atm. The graphite whiskers had such physical properties as high flexibility, tensile strength of 2100 kg/mm$^2$ at maximum, modulus of elasticity of $7.1 \times 10^4$ kg/mm$^2$ and specific resistance of 60 to 76 $\mu$ohm — cm. Although each graphite whisker was not a single crystal formation in a strict sense, the crystals of the graphite whisker were arranged in the form of a single continuous sheet rolled up like a scroll or a plurality of separate sheets rolled up in concentrical relationship, the c-axis of the crystals being orientated exactly perpendicular to the fiber axis. However, this process was accompanied with various unsettled difficult problems with respect to the manufacturing apparatus and the operation thereof. The process, therefore, was far short of the object of industrial mass production and still remained in an experimental stage.

The other type of prior art processes which has already been reported by many researchers, for example, U.S. Pat. No. 3,378,345, consisted in depositing carbon fibers in a gas phase by thermally decomposing hydrocarbon gases having a relatively low molecular weight (which are outside of the high molecular weight condensed polycyclic compounds employed in this invention). Although some reports referred to the carbon fibers obtained as graphite whiskers, said fibers were actually of nearly the same grade as those commercially available at present, as judged from data on the various physical properties. For example, the reported fibers had a tensile strength equal to about one-fifth of that of the graphite whiskers experimentally formed by Roger Bacon, and as high a specific electric resistivity in the direction of the fiber axis as scores of times that of true graphite whiskers.

SUMMARY OF THE INVENTION

It is accordingly the object of this invention to provide a method for easily attaining the industrial mass production of graphite whiskers having similar crystal structure and physical properties to those obtained by the aforesaid Roger Bacon process which uses a dc arc at high temperature and pressure.

A method for manufacturing graphite whiskers which comprises the steps of gasifying one or more liquefied organic compounds having a condensed polycyclic structure of substantially two to five benzene rings, the atomic ratio of H/C thereof being 1 at most; mixing the gasified substance derived from one part by volume of the liquefied organic compound with 500 to 5000 parts by volume of an inert gas mixed with 0.1 to 5 parts by volume of an active gas selected from the group consisting of carbon monoxide, carbon dioxide and water vapor; passing the gaseous mixture at a substantially atmospheric pressure through a reaction furnace containing therein a heat-resistant substrate to deposit thereon thermally cracked carbon nuclei at a temperature of from 700° to about 890° C for a period of at least 5 minutes, followed by 900° to 1200° C to obtain precursory carbon whiskers at a growing velocity of at least 0.5 mm per minute; and graphitizing the precursory carbon whiskers in another furnace at a temperature of from 2700° to 3000° C for a period of from 1 to 10 minutes in an atmosphere of inert gas.

Other important objects and advantageous features of this invention will be apparent from the following description and accompanying drawings, wherein, for the present purpose of illustration only, specific embodiments of this invention are set forth in detail.

DETAILED DESSCRIPTION OF THE INVENTION

Figure 1:
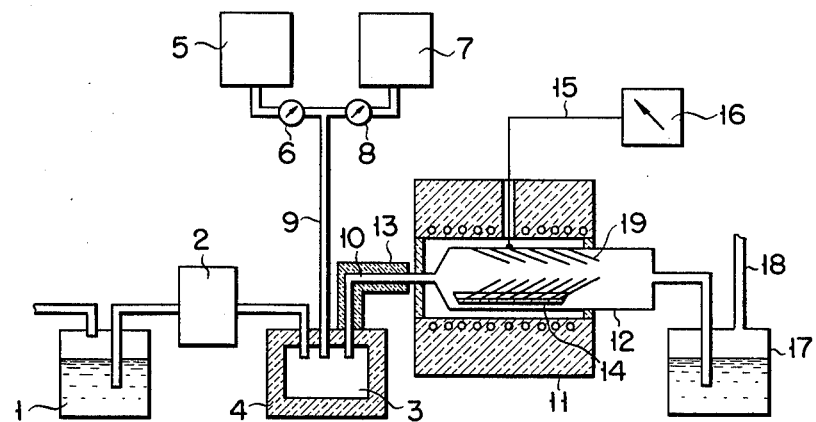
FIG. 1 is a schematic flow sheet of the process used in the steps of obtaining precursory carbon whiskers of this invention.

The method of this invention uses one or more raw condensed polycyclic organic compounds having from two to five benzene rings. Particularly preferred raw materials are tricyclic and/or tetracyclic compounds having a boiling point of from 300° to 450° C, such as anthracene, phenanthrene, chrysene, fluoranthrene and pyrene. A fraction of 300° to 450° C distillate obtained from coal tar or a residue of thermally cracked petroleum oil mainly consists of preferred components, and can be economically used as a raw material. Anthracene oil is also industrially applicable as a raw material. Before, however, these raw materials are used, it is necessary to remove sulfur therefrom.

There will now be described the method of this invention for manufacturing graphite whiskers. Liquefied raw material is charged for vaporization at the fixed rate into a gasification chamber maintained at 300° to 450° C. The chamber is further filled with an inert gas such as argon or nitrogen and an active gas having one or more oxygen atoms such as water vapor, carbon monoxide or carbon dioxide mixed to the proper ratio. In this case, hydrogen can be used as an inert gas instead of argon or nitrogen because that hydrogen does not react with carbon and the abovementioned active gas in a temperature range of from 700° to 1200° C. Said mixing should be effected in such a ratio that with the flow rate of the raw liquid material taken as one part by volume, that of the inert gas is chosen to be 500 to 5000 parts by volume and that of the active gas to be 0.1 to 5 parts by volume. It has been experimentally provided that a mixing ratio outside of the above-mentioned ranges fails to attain the efficient production of desired graphite whiskers. Although the thermal decomposition of a raw material permits the deposition of carbon whiskers even without using any active gas, the present inventors have further recognized that, since the thermal decomposition is a dehydrogenating reaction, addition of a small amount of an active gas having an atom or atoms of oxygen to the gaseous phase promotes the deposition of carbon whiskers to relieve the requisite conditions for said deposition enabling a large amount of carbon whiskers to be efficiently produced. Where ordinary carbon whiskers are manufactured from benzene or toluene with any other gas than hydrogen used as a carrier gas, it is reported that the deposition of carbon whiskers is generally impossible. This fact clearly shows that this invention using different raw materials and carrier gases from those applied in the prior art process has a prominently advantageous effect on the growth of precursory carbon whiskers.

The above-mentioned gaseous mixture is charged into a reaction furnace maintained at 700° to about 890° C and a substantially atmospheric pressure. A heat resistant substrate received in the furnace consists of a plate, tube or fibrous mass of graphite, carbon, ceramics, a metal or quartz. When the gaseous mixture is thermally decomposed in the reaction furnace, carbon nuclei are deposited on the substrate and carbon whiskers are grown around said carbon nuclei at a temperature of 900° to 1200° C for a period of at least 5 minutes. The carbon nuclei take the form of fine particles or collectively a linear or plate form depending on the ratio in which a raw hydrocarbon gas and a carrier gas are mixed. Thus, precursory whiskers are produced by a simple reaction.

Again, the carbon nuclei are easily formed when decomposition temperature stands at a relatively low level as 700° to about 890° C. On the other hand, a relatively high reaction temperature as 900° to 1200° C facilitates the growth of preliminary carbon whiskers around the carbon nuclei. In the latter case, the gaseous mixture should preferably have a composition the same as, or more concentrated than in the growth of the carbon nuclei.

When the carbon nuclei and precursory carbon whiskers are produced in two steps where slightly different conditions are involved, then it is possible to provide substantially flawless long fibers 1 to 50 microns in diameter.

Precursory carbon whiskers each consist of numerous carbon crystals orientated in the form of a single sheet which is rolled up like a scroll with a helical cross section or a plurality of separate sheets rolled up in a concentric relationship. The $d$-spacing of crystals, that is, $d(002)$A, is about 3.48 and the orientation degree thereof is 80 to 85%. (The term "orientation degree", as used herein, is defined to mean a value measured by a densitometer from the X-ray diffraction photograph of the Laue method. In this case, the c-axis orientation of all carbon crystals perpendicular to the fiber axis is taken as 100%, and the c-axis orientation of all carbon crystals parallel with the fiber axis is taken as 0%.) Further, the value of Bacon Anisotropy Factor is in the range of from 20 to 23.

Finally, the precursory carbon whiskers are heat-treated for a period of from 1 to 10 minutes in an ordinary furnace containing an atmosphere of an inert gas such as argon or nitrogen at temperatures from 2700° to 3000° C or preferably 2700° to 2800° C so as to effect the full graphitization of the carbon fibers, and the reorientation of carbon crystals, thereby obtaining desired true graphite whiskers. The $d$-spacing or $d(002)$A of the crystals constituting the graphite whiskers produced is about 3.35, which is smaller than that of the precursory carbon whiskers. Further, the graphite whiskers obtained have an orientation degree of about 99% which is very close to that of the ideal single crystal graphite whiskers, a tensile strength of more than 1000 kg/mm$^2$ as against about 200 kg/mm$^2$ of the precursory carbon whiskers, and a specific electric resistance of about $6 \times 10^{-5}$ ohm-cm as against about $5 \times 10^{-3}$ ohm-cm of the precursory carbon whiskers. The graphite whiskers are produced with a yield of about 20 to 50% based on the carbon content of the raw material used.

Figure 3:
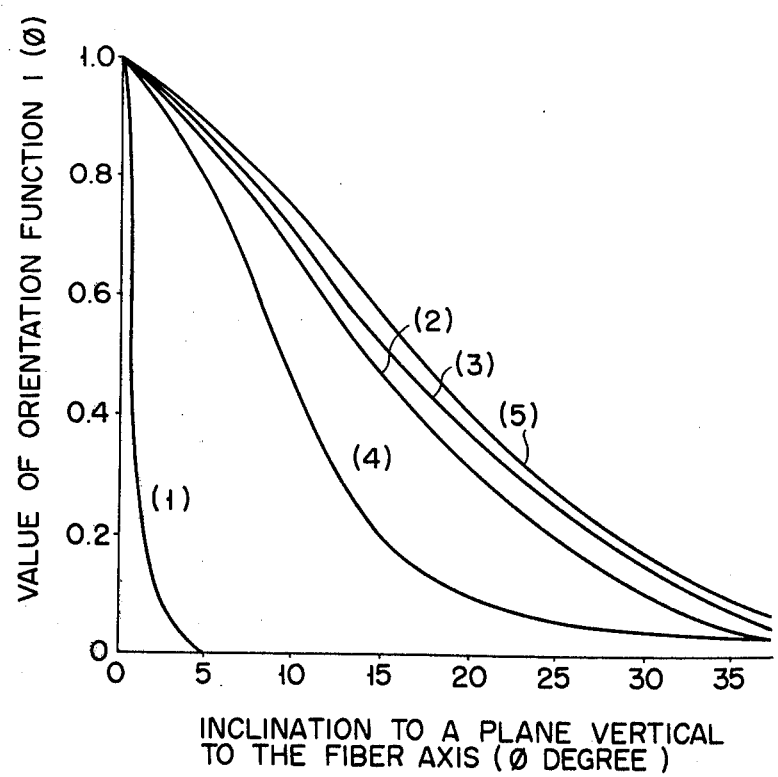
FIG. 3 is a curve diagram showing the relationship between the inclinations $\phi$ of a carbon crystal basal plane to the fiber axis and the value of normalized orientation density $I(\phi)$ of carbon crystal basal plane parallel to the fiber axis in various carbon fibers and whiskers.

The curve diagram was prepared in such a manner that where 1 was taken to represent the number of those of the carbon crystals whose basal plane was parallel to the fiber axis, then the distribution of the numbers of the carbon crystals, whose basal plane was inclined at an angle of $\phi$ to the fiber axis, was indicated by a curve for each carbon fiber. As apparent from FIG. 3, a sharper curve represents a better orientation of carbon crystals. In the case of single crystal graphite whisker, these results $I(O) = 1$, namely, the curve is aligned with the ordinate of FIG. 3. The curve 1 represents a graphite whisker prepared by the method of this invention; the curve 2 a precursory carbon whisker obtained by the method of this invention; the curve 3 a carbon fiber produced by the thermal decomposition of benzene; the curve 4 a commercially available high modulus carbon fiber; and the curve 5 a commercially available carbon fiber of great tensile strength. FIG. 3 shows that the graphite whiskers of this invention present a crystal orientation closely resembling that of single crystal graphite whiskers.

Figure 4:
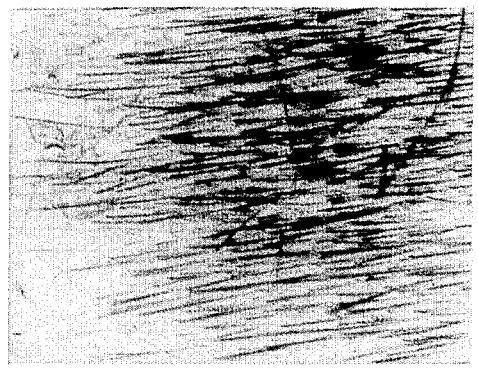
FIG. 4 is a 23-fold microscopic photograph showing a bundle of precursory carbon fibers grown on a substrate.

FIG. 4 is a 23-fold microscopic photograph showing the growth of numerous precursory carbon whiskers on a substrate of a reaction furnace.

Figure 5:
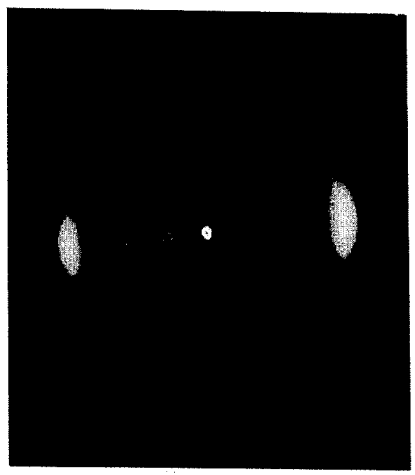
FIG. 5 is a Laue X-ray photograph of (002) diffraction with a diffracted beam set perpendicular to a precursory carbon fiber obtained by the method of this invention.
Figure 6:
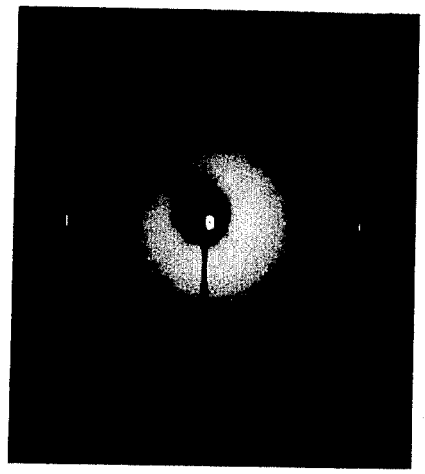
FIG. 6 is a Laue X-ray photograph of (002) diffraction with a diffracted beam set perpendicular to a graphite whisker obtained by the method of this invention.

FIG. 5 is an X-ray Laue photograph of (002) diffraction indicated by a precursory carbon whisker prepared by the method of this invention and FIG. 6 is a similar photograph of a graphite whisker obtained by said method. FIG. 6 shows that the graphite whisker of this invention has a crystal structure closely resembling that of single crystal graphite whisker.

Figure 7:
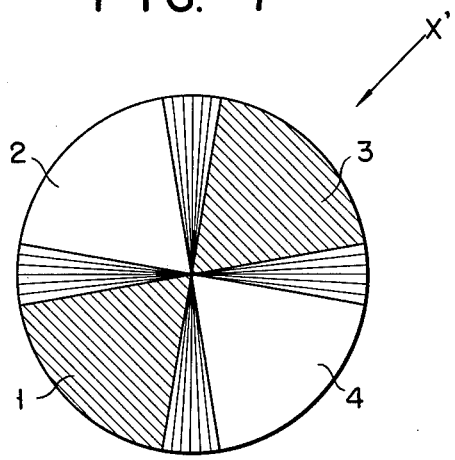
FIGS. 7 and 8 are sketches of the cross section of a graphite whisker obtained by the method of this invention which are drawn by observation through a 600-fold polarizing microscope.
Figure 8:
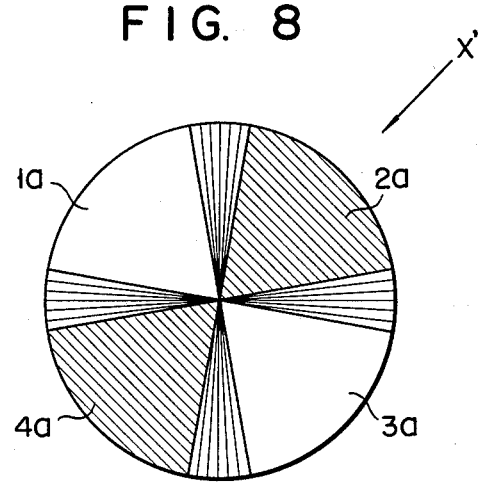

FIGS. 7 and 8 are sketches of the cross section of a graphite whisker of this invention drawn by observation through a 600-fold polarizing microscope. FIG. 8 is a sketch of said cross section of FIG. 7 rotated 90° about the axis thereof. Where a gypsum detecting plate is placed below the crossed nicols, the sections 1 and 3 of FIG. 7 and the sections 2a and 4a present a blue color in case the $x'$ axis of the gypsum detecting plate is aligned with the c-axis of graphite crystals, and the sections 2 and 4 of FIG. 7 and the sections 1a and 3a of FIG. 8 indicate a yellow color, in case the $x'$ axis of the detecting plate and the c-axis of graphite crystals intersect each other at right angles. As apparent from the sketches of FIGS. 7 and 8, the c-axis of the crystals of the graphite whiskers of this invention is radially oriented at right angles to the fiber axis all over the cross section.

The graphite whiskers of this invention have an equal quality of that of natural graphite, a crystal structure approximately that of single crystal graphite whiskers, and similar physical properties to those of Bacon's graphite whiskers. The graphite whiskers produced by the method of this invention have the tensile strength in a room temperature of at least 1,000 kg/mm$^2$, on the average $1 \times 10^3$ kg/mm$^2$, and the modulus of elasticity of at least $50 \times 10^3$ kg/mm$^2$, on the average $55 \times 10^3$ kg/mm$^2$.

This invention has attained for the first time an industrially suitable method for manufacturing graphite whiskers with far greater ease than with Bacon's process. Therefore, the graphite whiskers of the invention are expected to open up various industrial applications for excellent carbon fibers. One example is a reinforced composite material consisting of the graphite whiskers incorporated in a thermosetting resin or a molten metal.

The method of this invention will be more fully understood by reference to the following examples.

EXAMPLE 1

Figure 2:
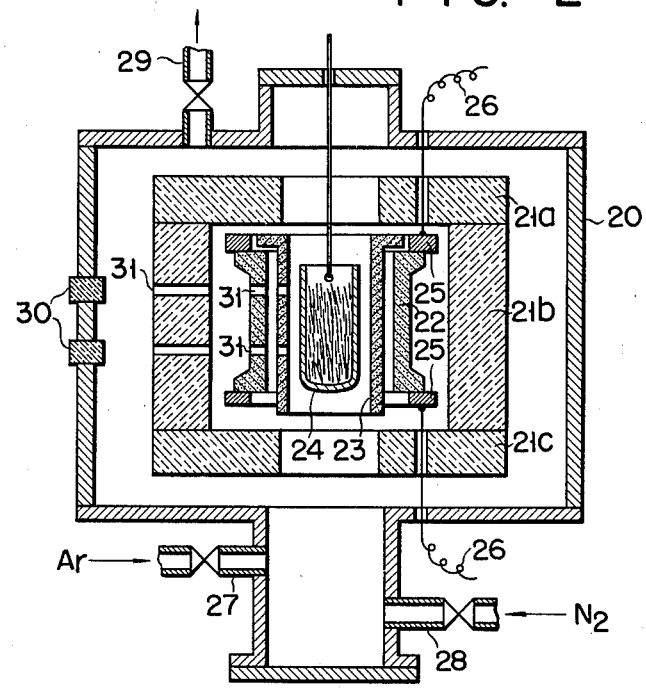
FIG. 2 is a longitudinal sectional view of an ordinary graphitizing furnace used in all examples of this invention.

Graphite whiskers were produced from a desulfurized fraction of 300° to 450° C distillate obtained from a residue of thermally cracked crude oil, which contained 2% of mono- and bi-cycle compounds, 32% of tricyclic compound, 57% of tetracyclic compound and 9% (by volume respectively) of penta- and higher cyclic compounds, using the apparatus of FIGS. 1 and 2.

Referring to FIG. 1, the liquefied raw material 1 was introduced for gasification into a gasification chamber 3 heated to 500° C by a mantle heater 4 with the flow rate adjusted to 0.8 c.c. per minute by a minipump 2. On the other hand, argon gas 5 at room temperature was drawn out through a flow meter 6 at the rate of 1500 c.c. per minute, and steam 7 at 110° C was delivered through a flow meter 8 at the rate of 0.4 c.c. per minute. While being mixed during transit through a duct 9, both carrier gases were also charged into the gasification chamber 3 maintained at 500° C. The mixture of raw material and carrier gases were conducted through a duct 10 into an electric furnace 11 and then into a quartz tube 12 maintained at 700° C for 7 minutes, followed by raising the temperature to 1000° C in increments of 10° C per minute. The duct 10 was heated to 500° C by a ribbon heater 13. The quartz tube 12 has an inner diameter of 55 mm and a homogeneous heating zone 200 mm long. The quartz tube 12 contained a quartz boat 14, in which there was placed a substrate consisting of carbon fibers about 10 microns in diameter and about 0.1 mm long. A thermocouple 15 and millivoltmeter 16 were further provided to measure the temperature of the quartz tube 12.

After leaving the quartz tube 12, the residual mixture of raw gas material and carrier gases passed through the water in a washing vessel 17 and expelled through an exhaust 18. Both kinds of gas were made to travel through the quartz tube 12. After the flow of the gases stopped, the interior of the quartz tube 12 was cooled by argon gas. Numerous carbon whiskers 19, 1 to 10 microns in diameter and round in cross section, were deposited on the walls of the quartz tube 12, quartz boat 14 and carbon whisker substrate in a state arranged in the following direction of gas streams.

A bundle of the precursory carbon whiskers thus prepared was taken out of the quartz tube 12 and transferred to an ordinary graphitizing apparatus illustrated in FIG. 2.

Referring to FIG. 2, a graphitizing box 20 contains heat insulating materials 21a, 21b and 21c, a cylindrical graphite electrode 22 and a soaking cylinder 23. In the soaking cylinder 23 is suspended a graphite crucible 24. Both top and bottom surfaces of the cylindrical graphite electrode 22 are tightly fitted with copper electrode plates 25 connected to the corresponding electric conductors 26. Into the graphitizing box 20 are introduced argon or nitrogen gas through a gas inlet 27 or 28 so as to substitute the air in the graphitizing box 20 with these inert gases. Referential numeral 29 denotes an exhaust. The graphitizing box 20 has peep windows 30 formed in one of the side walls. The peep window 30 enables the color of the heated graphite crucible 24 to be observed through small holes bored in the heat insulating material 21b, the cylindrical graphite electrode 22 and the soaking cylinder 23, thereby determining the temperature of the graphite crucible 24 by an optical pyrometer (not shown in the figure).

After the aforesaid bundle of precursory carbon whiskers was placed in the graphite crucible 24, electric current was introduced through the conductors 26 to heat the graphite crucible 24 to 2800° C in argon atmosphere. Under this condition the precursory carbon whiskers were heat-treated 10 minutes. The physical properties of graphite whiskers obtained are presented in Tables 1 and 2 given later together with those of the graphite whiskers prepared in the other examples and controls. Graphite whiskers were produced with a yield of 32% based on the carbon content of the raw material used.

EXAMPLE 2

Graphite whiskers were produced from the same raw material and with the same apparatus as used in Example 1. The quartz boat 14 of Example 1 was replaced by a graphite plate and an alumina plate. The apparatus was charged with the liquefied raw material at the flow rate of 1.0 c.c. per minute, hydrogen as an inert gas at the flow rate of 3000 c.c. per minute and steam as an active gas at the flow rate of 1.0 c.c. per minute. The quartz tube 12 was heated 10 minutes at 800° C, and thereafter the temperature was increased to 1000° C in increments of 5° C per minute. When the interior of the quartz tube 12 was cooled in the same manner as in Example 1, numerous precursory carbon whiskers 5 to 30 microns in diameter and 5 to 8 cm long were deposited on the inner walls of the quartz tube 12 and the upper surfaces of the qraphite and alumina plates. A bundle of the precursory carbon whiskers obtained was transferred to the same graphitizing apparatus as in Example 1 to be heat-treated 10 minutes at 2700° C, producing with a yield of 47% graphite whiskers whose physical properties are set forth in Tables 1 and 2.

EXAMPLE 3

Numerous precursory carbon whiskers 5 to 50 microns in diameter and 5 cm long were grown by the same operation as in Example 2 from a desulfurized fraction of 300° to 450° C distillate obtained from coal tar, which contained 1% by volume of mono- and bycyclic compounds, 28% by volume of tricyclic compound, 56% by volume of tetracyclic compound and 15% by volume of penta- and higher polycyclic compounds. A bundle of the precursory carbon whiskers was graphitized 5 minutes at 2800° C, producing with a yield of 23% graphite whiskers whose physical properties are presented in Tables 1 and 2.

EXAMPLE 4

Graphite whiskers were produced in the same manner as in Example 2 from a raw material of anthracene oil containing about 70% by weight of anthracene and phenanthrene with nitrogen used as an inert carrier gas and carbon dioxide used as an active carrier gas. To the gasified raw material derived from 1.5 c.c. per minute of anthracene oil were added a carrier gas of nitrogen at the flow rate of 4000 c.c. per minute and a carrier gas of carbon dioxide at the flow rate of 2 c.c. per minute, thereby forming numerous precursory carbon whiskers 5 to 30 microns in diameter and about 5 cm long. A bundle of the precursory carbon whiskers thus formed was graphitized one minute at 2900° C, obtaining with a yield of 35% graphite whiskers whose properties are shown in Tables 1 and 2, which also indicate the physical properties of controls such as graphite whiskers obtained by Bacon's method, carbon fibers prepared by thermal decompositions of benzene, commercially available high modulus carbon fibers produced from polyacrylonitrile and commercially available carbon fibers of great tensile strength derived from polyacrylonitrile.

Table 1

| | Characteristics of Orientated Carbon Crystals | | | |
|---|---|---|---|---|
| | Heat-treating temperature (°C) | d-Spacing d (002)Å | Orientation degree (%) | Bacon Anisotrophy Factor |
| Example 1 | | | | 21 |
| Precursor | 1000 | 3.48 | 82.5 | 500 to |
| Whisker | 2800 | 3.35 | 98.9 | 4500 |
| Example 2 | | | | 22 |
| Precursor | 1000 | 3.48 | 84.0 | 370 to |
| Whisker | 2700 | 3.35 | 97.5 | 4000 |
| Example 3 | | | | 21 |
| Precursor | 1000 | 3.48 | 81.5 | 500 to |
| Whisker | 2800 | 3.35 | 98.7 | 4500 |
| Example 4 | | | | 21 |
| Precursor | 1000 | 3.48 | 82.0 | 500 to |
| Whisker | 2900 | 3.35 | 98.9 | 4500 |
| Bacon's graphite whisker | 3400 | — | — | — |
| Carbon fiber obtained from benzene | 1300 | 3.47 | 80.7 | 17 |
| High modulus Carbon fiber obtained from polyacrylonitrile | about 2800 | 3.41 | 90.7 | 49 |
| Carbon fiber of great tensile strength obtained from polyacrylonitrile | about 1500 | 3.44 | 86.3 | 15 |

Table 2

| | Physical Properties of Carbon Fibers and Whiskers | | | |
|---|---|---|---|---|
| | Diameter (micron) | Average tensile strength (kg/mm$^2$) | Average modulus of elasticity ($10^4 \times$ kg/mm$^2$) | Specific electric resistance (ohm-cm) |
| Example 1 | | | | |
| Precursor | 1 to 10 | more than 200 | — | (1 to 5)×10$^{-3}$ |
| Whisker | | more than 1000 | more than 5.0 | (6 to 7)×10$^{-5}$ |
| Example 2 | | | | |
| Precursor | 5 to 30 | more than 200 | — | (1 to 5)×10$^{-3}$ |
| Whisker | | more than 1000 | more than 5.0 | (6 to 7)×10$^{-5}$ |
| Example 3 | | | | |
| Precursor | 5 to 50 | more than 200 | — | (1 to 5)×10$^{-3}$ |
| Whisker | | more than 1000 | more than 5.0 | (6 to 7)×10$^{-5}$ |
| Example 4 | | | | |
| Precursor | 1 to 30 | more than 200 | — | (1 to 5)×10$^{-3}$ |
| Whisker | | more than 1000 | more than 5.0 | (6 to 7)×10$^{-5}$ |
| Bacon's graphite whisker | 1 to 5 | 2000 | 7.1 | (6 to 7)×10$^{-5}$ |
| Carbon fiber obtained from benzene | 7 to 70 | 4 to 340 | 1.8 to 4.0 | (1 to 2)×10$^{-3}$ |
| High modulus | | | | |

Table 2-continued

| | Physical Properties of Carbon Fibers and Whiskers | | | |
|---|---|---|---|---|
| | Diameter (micron) | Average tensile strength (kg/mm$^2$) | Average modulus of elasticity (10$^4$× kg/mm$^2$) | Specific electric resistance (ohm-cm) |
| carbon fiber obtained from polyacrylonitrile | 7 to 8 | 210 | 4.2 | (0.7 to 1)×10$^{-3}$ |
| Carbon fiber of great tensile strength obtained from polyacrylonitrile | 7 to 8 | 240 | 3.5 | (0.5 to 1)×10$^{-2}$ |

What we claim is:

1. A method for manufacturing graphite whiskers having a diameter of from 1 to 50 microns, a tensile strength of at least 1,000 kg/mm$^2$ and a modulus of elasticity of at least 5 × 10$^4$ kg/mm$^2$, which comprises the steps of gasifying one or more liquefied organic compounds having a condensed polycyclic structure of substantially two to five benzene rings, the atomic ratio of H/C thereof being 1 at most; mixing the gasified substance derived from one part by volume of the liquefied organic compound with 500 to 5000 parts by volume of an inert gas mixed with 0.1 to 5 parts by volume of an active gas selected from the group consisting of carbon monoxide, carbon dioxide and water vapor; passing the resulting gaseous mixture at a substantially atmospheric pressure through a reaction furnace containing therein a heat-resistant substrate to deposit thereon thermally cracked carbon nuclei at a temperature of from 700° to about 890° C. for a period of at least 5 minutes, followed by 900° to 1200° C. to obtain precursory carbon whiskers at a growing velocity of at least 0.5 mm per minute; and graphitizing the precursory carbon whiskers in another furnace at a temperature of from 2700° to 3000° C. for a period of from 1 to 10 minutes in an atmosphere of inert gas.

2. The method according to claim 1, wherein the liquefied organic compound having a condensed polycyclic structure is one selected from the group consisting of anthracene, phenanthrene, chrysene, fluoranthene and pyrene.

3. The method according to claim 1, wherein the liquified organic compound comprises anthracene oil.

4. The method according to claim 1, wherein the liquefied organic compound comprises a 300° to 450° C distillate fraction obtained from desulfurized coal tar.

5. The method according to claim 1, wherein the liquefied organic compound comprises a 300° to 450° C distillate fraction obtained from a desulfurized residue of thermally cracked petroleum oil.

6. The method according to claim 5, wherein the petroleum oil is one selected from the group consisting of crude oil and naphtha.

7. The method according to claim 1, wherein the inert gas is one selected from the group consisting of nitrogen and argon.

* * * * *